(12) United States Patent
Mukund et al.

(10) Patent No.: US 8,332,197 B2
(45) Date of Patent: Dec. 11, 2012

(54) SIMULATION OF COMPLEX SYSTEM ARCHITECTURE

(75) Inventors: Shridhar Mukund, San Jose, CA (US); Jinesh Parikh, Milpitas, CA (US)

(73) Assignee: PMC-Sierra US, Inc., Santa Clara, CA (US)

( * ) Notice: Subject to any disclaimer, the term of this patent is extended or adjusted under 35 U.S.C. 154(b) by 2240 days.

(21) Appl. No.: 10/712,711

(22) Filed: Nov. 12, 2003

(65) Prior Publication Data

US 2004/0153302 A1 Aug. 5, 2004

Related U.S. Application Data

(60) Provisional application No. 60/433,490, filed on Dec. 12, 2002.

(51) Int. Cl.
*G06F 17/50* (2006.01)
*G06F 11/00* (2006.01)
*G01R 31/28* (2006.01)

(52) U.S. Cl. .......................................... 703/14; 714/741
(58) Field of Classification Search .................... 703/14, 703/13; 714/741
See application file for complete search history.

(56) References Cited

U.S. PATENT DOCUMENTS

| | | | |
|---|---|---|---|
| 4,916,647 A | 4/1990 | Catlin | |
| 5,815,714 A * | 9/1998 | Shridhar et al. | 717/129 |
| 5,870,588 A | 2/1999 | Rompaey et al. | |
| 5,926,475 A | 7/1999 | Saldinger et al. | |
| 6,044,061 A | 3/2000 | Aybay et al. | |
| 6,072,772 A | 6/2000 | Charny et al. | |
| 6,195,739 B1 | 2/2001 | Wright et al. | |
| 6,330,236 B1 | 12/2001 | Ofek et al. | |
| 6,678,645 B1 | 1/2004 | Rajsuman et al. | |
| 6,820,219 B1 | 11/2004 | Huang et al. | |
| 2002/0002483 A1 | 1/2002 | Siegel et al. | |
| 2002/0064170 A1 | 5/2002 | Siu et al. | |
| 2002/0124155 A1 | 9/2002 | Sami et al. | |
| 2002/0152061 A1 * | 10/2002 | Shimogori et al. | 703/21 |

OTHER PUBLICATIONS

Chen et al., "Performance Modeling for the Panda Array I/O Library," IEEE Doc. No. 0-89791-854-1/1996, IEEE 1996, Abstract, Introduction, Sections 2-4, Computer Science Department, University of Illinois, Urbana, IL, U.S.A.

* cited by examiner

*Primary Examiner* — Suzanne Lo
(74) *Attorney, Agent, or Firm* — Martine Penilla Group, LLP

(57) ABSTRACT

A method for simulating a chip is provided. The method initiates with defining a library of components for a processor. Then, the interconnections for a set of pipelined processors including the processor are defined. Next, a processor circuit is generated by combining the library of components and the interconnections for the set of pipelined processors. Then, a code representation of a model of the set of pipelined processors is generated. Next, the signals generated by the code representation are compared to the signals generated by the processor circuit. If the comparison of the signals is unacceptable, then the method includes identifying a cause of the unacceptable comparison of the signals at a block level of the processor circuit. A method for generating a netlist for a pipeline of processors, a method for debugging the processor circuit and computer code for simulating a chip circuit are also provided.

3 Claims, 9 Drawing Sheets

SIMULATION OF COMPLEX SYSTEM ARCHITECTURE

CROSS REFERENCE TO RELATED APPLICATIONS

This application claims priority from U.S. Provisional Patent Application No. 60/433,490 filed Dec. 12, 2002 and entitled "Simulation of Complex System Architecture." This provisional application is herein incorporated by reference.

BACKGROUND OF THE INVENTION

1. Field of the Invention

This invention relates generally to networking and more particularly to a method and apparatus for improving the simulation and testing of a semiconductor based multi-processor system.

2. Description of the Related Art

As semiconductor chips become more dense, i.e., the gate counts on a chip becomes larger, the simulation and the testing of the semiconductor chips is becoming a bottleneck in the process. Chips having large gate counts, i.e., between 5 and 10 million, gates causes a challenge for developers because of the increased time required to simulate and test the chip circuit prior to manufacturing the chip. In turn, the increased time for the simulation and testing further exasperates the time required for the development cycle of a semiconductor processor.

Another trend occurring with the semiconductor chips being produced is that the designs are becoming more modular, where common blocks are replicated a number of times in the chip design. FIG. 1 is a simplified block diagram of a modular design of a semiconductor chip. Chip 100 includes blocks A-F, where block A is represented twice. For example, block A could be a memory that is replicated. It should be appreciated that the replication can be exactly the same block or substantially the same block.

The substantially similar blocks are still completely tested as there does not exist a simulation method or apparatus that can execute at the block level. One solution to decrease the burgeoning time for simulation and testing is not to entirely test the entire chip. However, failure to catch and fix a defect will have drastic consequences. Thus, decreased testing is not an optimal solution.

Another shortcoming of the development process is that when a change to an existing defined architecture occurs as the development process moves forward, a new structural net list is created from the beginning rather than adjusting the pre-existing netlist. To create the structural net list from the beginning incurs a large amount of time, especially for a change that may be minor. An example of a minor change is an increase or decrease in a memory size, which is a common change throughout the development process. Thus, there is a large penalty in terms of development time as a consequence of the minor change.

In view of the foregoing, there is a need to fully test a newly developed chip in an efficient manner so that the development time can be minimized. Additionally, minor changes need to be accommodated without incurring a large time penalty.

SUMMARY OF THE INVENTION

Broadly speaking, the present invention fills these needs by providing a method and apparatus allowing for the efficient testing and simulation of a chip circuit, thereby minimizing development time. It should be appreciated that the present invention can be implemented in numerous ways, including as a process, an apparatus, a system, or a device. Several inventive embodiments of the present invention are described below.

In one embodiment, a computer readable medium having program instructions for simulating a chip circuit is provided. Program instructions for defining a library of components for a processor and program instructions for defining interconnections for a set of pipelined processors including the processor are included. Program instructions for generating a processor circuit by combining the library of components and the interconnections for the set of pipelined processors are provided. Program instructions for generating a code representation of a model of the set of pipelined processors and program instructions for comparing signals generated by the code representation to signals generated by the processor circuit are included. If the comparison of the signals is unacceptable, the computer readable medium includes program instructions for identifying a cause of the unacceptable comparison of the signals at a block level of the processor circuit.

In another embodiment, a method for simulating a chip circuit is provided. The method initiates with defining a library of components for a processor. Then, the interconnections for a set of pipelined processors including the processor are defined. Next, a processor circuit is generated by combining the library of components and the interconnections for the set of pipelined processors. Then, a code representation of a model of the set of pipelined processors is generated. Next, the signals generated by the code representation are compared to the signals generated by the processor circuit. If the comparison of the signals is unacceptable, then the method includes identifying a cause of the unacceptable comparison of the signals at a block level of the processor circuit.

In yet another embodiment, a method for debugging a chip circuit is provided. The method initiates with identifying a block level location having an error from a first simulation. Then, a patch is inserted into a thread specific to the block level location of the error. Next, the simulation is executed to determine a signal level location of the error through information generated by the patch. Then, a code representation of a processor associated with the error is corrected.

In still yet another embodiment, computer code for simulating a chip circuit is provided. The computer code is configured to be executed on a server. The computer code includes logic for generating a processor circuit by combining a library of components and defined interconnections for a set of pipelined processors. Logic generating a code representation of a model of the processor and logic for comparing signals generated by the code representation to signals generated by the processor circuit are included. If the comparison of the signals is unacceptable, the logic for comparing signals includes logic for identifying a cause of the unacceptable comparison of the signals at a block level of the code representation.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Figure 1:
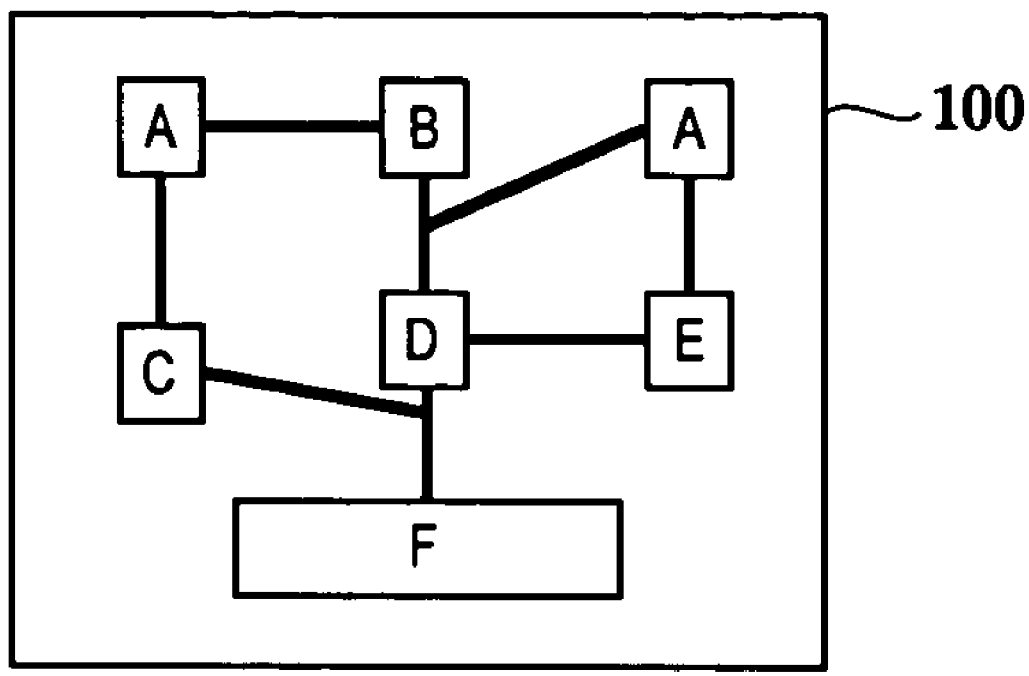
FIG. 1 is a simplified block diagram of a modular design of a semiconductor chip.

An invention is described for an apparatus and method for efficiently testing and simulating a processor circuit which includes accommodating minor changes without incurring a large time penalty. It will be obvious, however, to one skilled in the art, that the present invention may be practiced without some or all of these specific details. In other instances, well known process operations have not been described in detail in order not to unnecessarily obscure the present invention. FIG. 1 is described in the "Background of the Invention" section.

The embodiments described herein provide an apparatus and method for efficiently simulating and testing a chip circuit and an associated code representation. The embodiments described herein essentially break down a large instruction set into smaller instruction sets in order to minimize the time spent evaluating instruction sets that do not have defects.

Figure 2:
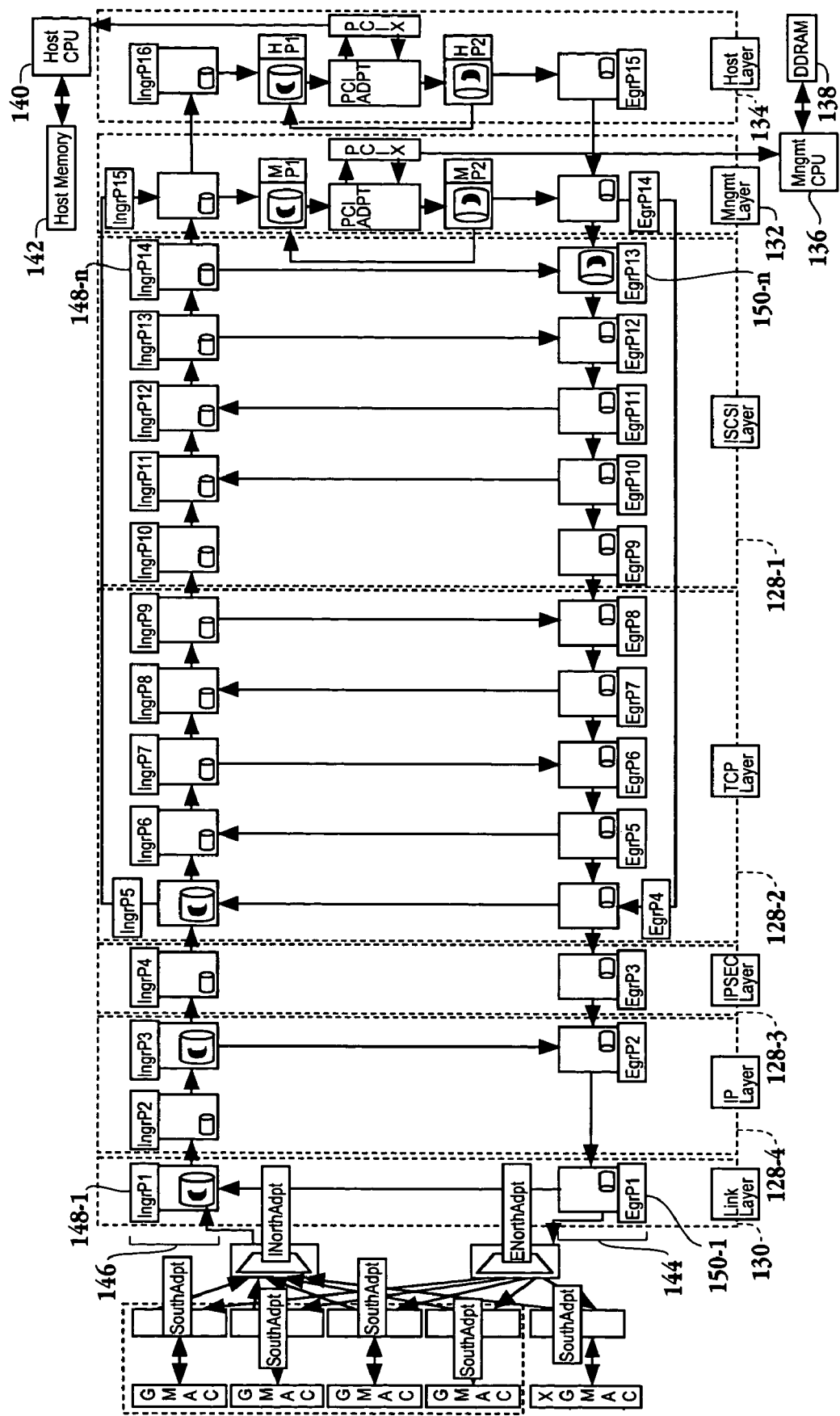
FIG. 2 is a schematic diagram illustrating a configuration of pipelined processors for processing different stages of a received packet in accordance with one embodiment of the invention.
Figure 4:
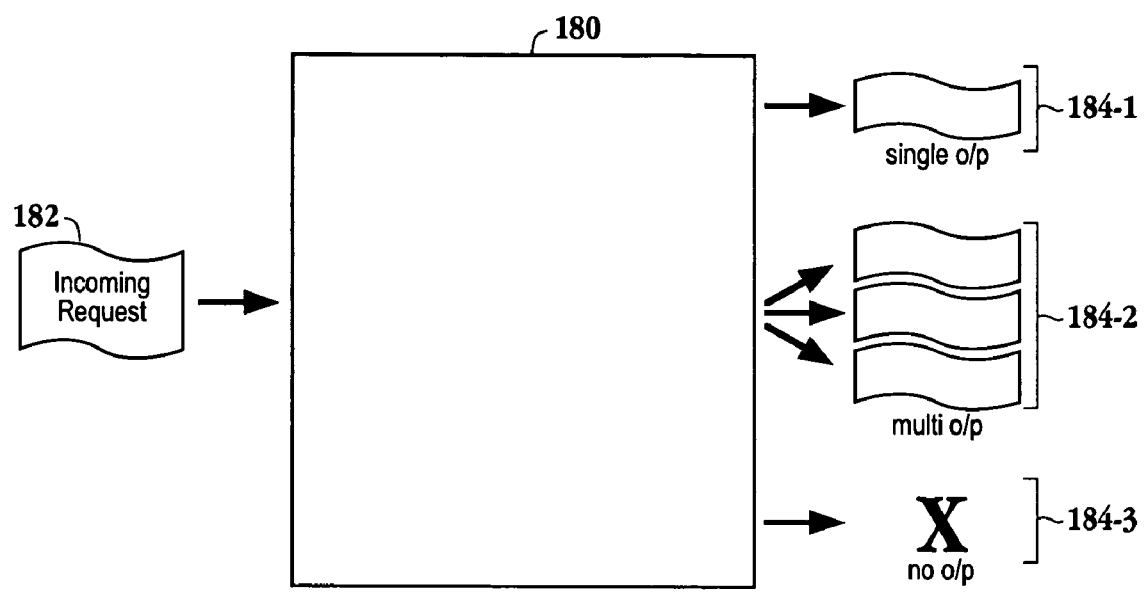
FIG. 4 is a simplified schematic diagram of the various output combinations resulting from an incoming packet to a processor in accordance with one embodiment of the invention.

FIG. 2 is a schematic diagram illustrating a configuration of pipelined processors for processing different stages of a received packet in accordance with one embodiment of the invention. As can be seen, each of the layers associated with the software stack, i.e., IP layer 128-4, IP SEC layer 128-3, TCP layer 128-2, ISCSI layer 128-1, have at least one processor associated with each layer to manipulate the data received from or sent to each of the stages. Processors 148-1 through 148-n make up the processing pipeline for the receiving side 146. Processors 150-1 through 150-n make up the processing pipeline for the transmit side 144. Layers 128-1 through 128-4 are located between link layer 130 and management layer 132. One skilled in the art will appreciate that link layer 130 provides the communication interface for an Ethernet connection, while management layer 132 provides the communication interface for the host layer 134. Management layer 132 includes management CPU 136, which is in communication with dynamic random access memory (DRAM) 138. Host layer 134 contains a communication interface with host CPU 140 which is also in communication with host memory 142. In one embodiment, each of the processors 148-1 through 148-n and 150-1 through 150-n contain at least three memory regions in order to maintain a line throughput rate for a receiving or transmitting data stream. It should be appreciated that while a certain number of processors is shown in FIG. 4 for each layer, any suitable number of processors can be included in each layer. That is, the number of processors associated with each layer is any suitable number of processors in order to build or strip the data packets for the next processor. It will be apparent to one skilled in the art that the processors illustrated in FIG. 4 may be located on a printed circuit board and can be configured as a plug-in card. In addition, each of layers 128-1 through 128-4 may be referred to as pipeline stages.

Figure 3:
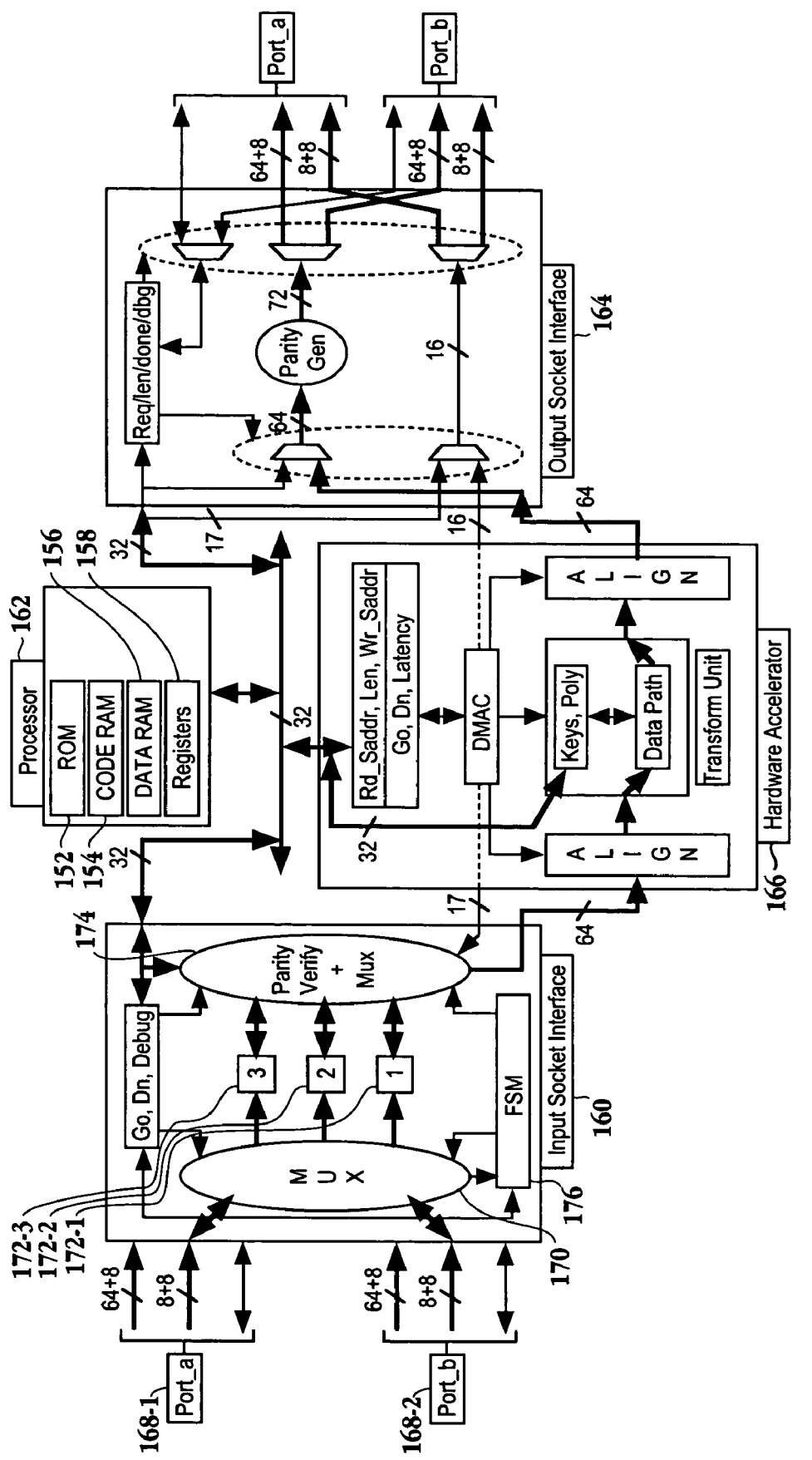
FIG. 3 is a schematic diagram illustrating the components of the pipeline processors in accordance with one embodiment of the invention.

FIG. 3 is a schematic diagram illustrating the components of the pipeline processors in accordance with one embodiment of the invention. Each of the pipelined processors include input socket interface 160, star processor 162, output socket interface 164 and hardware accelerator 166. It should be appreciated that for pipelined processors the output socket interface of a first processor is in communication with an input socket interface of a second processor, and so on for each of the pipelined processors. Input socket interface 160 has two input ports, port A 168-1 and port B 168-2. Each of these ports consists of a 72-bit data bus, a 16-bit address bus (8 bits of address and 8 bits as byte mask) and handshake signals. Data from port A 168-1 and port B 168-2 is communicated to multiplexer 170. In one embodiment, a scheduling algorithm schedules port A and port B requests in a round robin fashion. Multiplexer 170 distributes the packet data into three static random access memory (SRAM) locations. The three SRAM locations are represented by blocks 172-1 through 172-3. In another embodiment, SRAM regions 172-1 through 172-3 are single ported memories. The three single ported memories allow for the throughput rate to be maintained for an incoming data stream, while occupying a minimal amount of area on the chip surface. Each of the memories, also referred to as buffers, 172-1 through 172-3 are in communication with the parity verify in multiplex block 174. It will be apparent to one skilled in the art that the parity verify and multiplex block 174 is a piece of hardware that verifies the parity bits appended to a message. Input socket interface 160 includes finite state machine 176. In one embodiment, when a request is forwarded to the finite state machine, the finite state machine checks for space availability in the buffers 172-1 through 172-3. Here, a pointer points to the buffer that was last written to. If space is available in the buffer that was last written to, then this buffer is used for writing an incoming packet. In one embodiment, the buffer is used for multiple packets when it is determined that writing multiple packets to a buffer does not cause a delay in a subsequent reading operation.

Input socket interface 160 of FIG. 3, may be configured as a hold-off socket. That is, at times some data may come into the input socket that may need to access a data structure that is not in Data RAM 156 as the capacity of the Data Ram is limited. Thus, the data structure may be stored in external memory, such as dynamic random access memory (DRAM). If the associated data structure is not cached then it will have to be fetched from the external memory. In order to prevent hold up all the pipeline processing due to the data fetch, at least three buffers 172-1 through 172-3 are provided. In one embodiment, between 3 and 32 buffers are provided to maintain the line rate of the incoming data.

Processor 162 includes read only module (ROM) 152, code random access memory (RAM) 154 data RAM 156 and registers 158. The instruction for the processor to perform its functions is held in the code space provided by ROM 152 and code RAM 154. It should be appreciated that by dividing the code space into two parts allows for fixed code to be used in every stage of the pipeline of processors. Thus, common functions used by each processor of the pipeline are stored in ROM 152. Examples of a common function include instructions for downloading specific microcode for the pipeline stage and moving data between modules. Code RAM 154 contains the specific processing instructions for the functionality performed by the pipeline stage of which processor 162 is located. For example, processor 162 may perform specific functionality for the IPsec layer or one of the other stages described with reference to FIG. 2. Data RAM 156 enables the processor to access different data structures. For example, a TCP connection behind a TCP packet is associated with a protocol and a data structure. The processor must access the associated data structure to process the TCP packet. Similarly, for the IP layers and the iSCSI layer there will be associated data structures that are fetched and written back from a suitable media or external storage. In one embodiment, registers 158 provide the appropriate addresses in Data RAM 156 to access the appropriate data structures in the Data RAM. In addition, registers 158 provide temporary storage when writing microcode. In one embodiment of FIG. 3, after powering-up, code RAM 154 does not have any meaningful data in it. Accordingly, processor 162, upon power-up, will start executing a special system routine from ROM 152 which will initialize the first location of code RAM 154 with a jump statement to the right place in ROM.

Still referring to FIG. 3, Hardware Accelerator 166, also referred to a Transform unit, transforms the data. For example, when doing iSCSI processing a data digest or cyclic redundancy check (CRC) must be computed. Here, hardware accelerator 166 performs this function. Additionally, hardware accelerator 166 may perform some align functions. For example, the data may start at a certain offset at a first pipeline stage, but when the data is passed to a next pipeline stage it may be desired to start at a different offset, i.e., realign the data.

FIG. 4 is a simplified schematic diagram of the various output combinations resulting from an incoming packet to a processor in accordance with one embodiment of the invention. Processor 180 receives incoming request 182. Processor 180 then acts on the data and transmits an output (o/p). The output can be in the form of single output 184-1, multiple outputs 184-2 and no output 184-3. Thus, an incoming packet or message, represented by incoming request 182, may result in various combinations on the output as shown in FIG. 4. In one embodiment, after power initialization of the processor, the processor is loaded with a basic system microcode thread. On a specific request from the host this thread can load function specific microcode threads into its code memory. As will be explained in more detail below, the specific microcode threads support debugging features that allow for the efficient pinpointing of a defect. The single o/p and no o/p are simple examples of microcode executing once from start to end which is referred to as a thread. In order to produce multiple o/p's the microcode will self-trigger itself. That is, each output will be a result of microcode executing one thread. Hence, the processor will go through multiple self triggers processing multiple threads to produce all the required outputs. It will be apparent to one skilled in the art that there are some special situations when outputs are generated without any inputs. Some internal events, which are continuously monitored, can trigger a thread execution. One example is internal timer processing, where due to some timer expiry a thread sends a message. It should be appreciated that there are various threads through which the microcode can execute, which are governed by the functionality of that thread and by the events triggering the thread.

Figure 5:
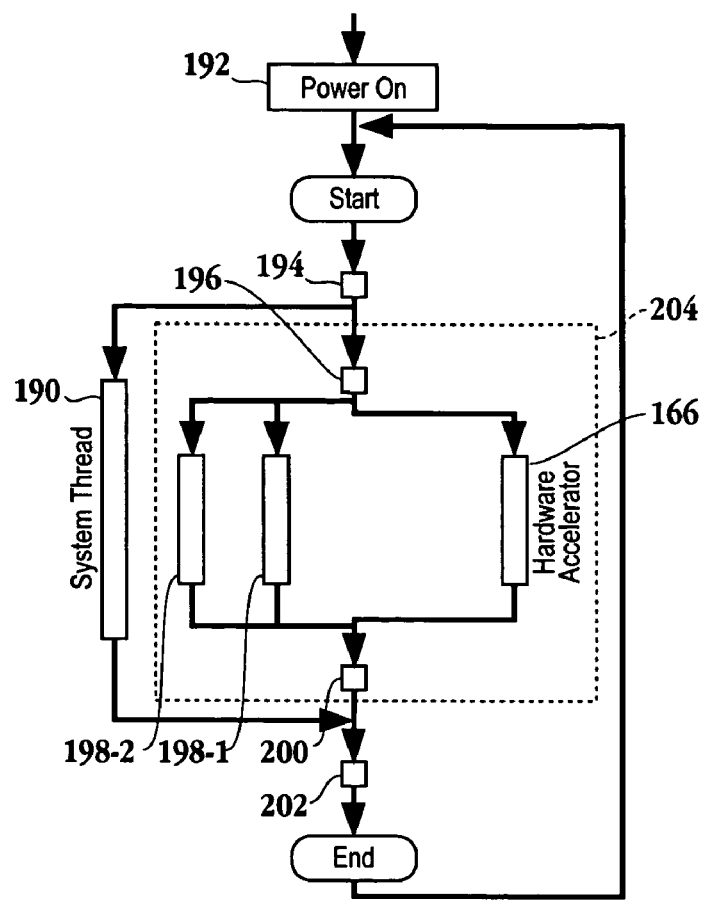
FIG. 5 is a block diagram illustrating the various threads through which the microcode enabling the debugging process can execute in accordance with one embodiment of the invention.

FIG. 5 is a block diagram illustrating the various threads through which the microcode enabling the debugging process can execute in accordance with one embodiment of the invention. System thread 190 is loaded from the ROM on power-up or on reset. The system thread contains some basic functionality of being able to read and write to or from instruction memory or any other memory location accessible to the processor. A standard debug feature built into system thread 190 enables the processor to debug packets after a certain number of data packets have been processed. The idea behind this concept is that all the operations of the pipeline processors, also referred to as the Star Complex, of FIG. 3 happen on packet boundaries. Therefore, the ability to read all the processor memories before and after a certain packet was processed, allows for the location of the fault from the completed processing. In one embodiment, a register is programmed with a number indicating the maximum number of packets which the processor processes. Following every packet processing operation, the number in the register is decremented by one. Thus, when the number in the register reaches zero, only debug messages are processed.

Continuing with FIG. 5, power-on event system thread 190 is loaded. Thus, the pathway for a generic event is depicted by generic event evaluator 194, through system thread 190 and then through generic event generator 202. In one embodiment, system thread 190 includes code which can provide access for any memory location. On the other hand, user threads 198-1 and 198-2 are specific to a particular block. For example, user threads 198-1 and 198-2 may be specific to a processor or stage of the pipeline illustrated with reference to FIG. 2. The pathway for a specific thread is illustrated within region 204, which includes specific event evaluator 196, user threads 198-1 and 198-2, specific event generator 200 and hardware accelerator 166. It should be appreciated that the pathway within region 204 is executed from the RAM, while the remainder of FIG. 5 is executed from the ROM associated with the processor with reference to FIG. 3.

Figure 6:
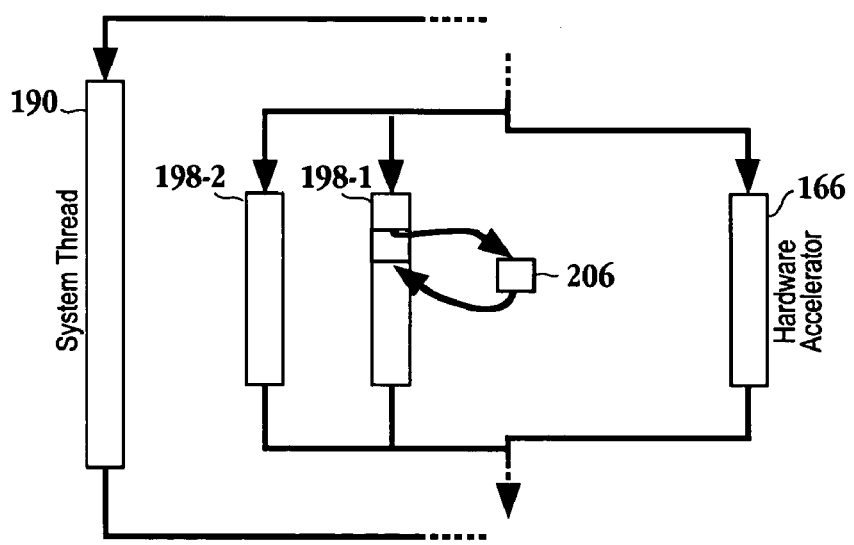
FIG. 6 is a more detailed schematic diagram illustrating a soft patching technique for debugging microcode in accordance with one embodiment of the invention.

FIG. 6 is a more detailed schematic diagram illustrating a soft patching technique for debugging microcode in accordance with one embodiment of the invention. In one embodiment, a debug feature which might require modifying microcode or temporarily adding a few lines of code could be achieved by using the soft patching technique explained herein. When a download message command is issued by the host with the microcode and location from where it has to be loaded, the system microcode will load the instruction into memory. After the load operation there will be another message that will set a flag in all the processors of the pipeline to switch to normal operation, wherein each of the processors responds to functional events. It should be appreciated that there could be an instance which requires a modification to the microcode to see some performance related numbers or debug a small situation. In order to accommodate these instances, a patch in the microcode may be implemented. In one embodiment, the patch could change the flow of the thread.

Patched code 206 is illustrated being input into user thread 198-1 in FIG. 6. In one embodiment, system thread 190 places patch 206 in user thread 198-1 and/or 198-2. In another embodiment, patch 206 is loaded similarly to the process in which the whole microcode is loaded. As mentioned above, patch 206 is composed of code. In summary, system thread 190 pinpoints the location of a bug or defect at the block level during the first running of the simulation. Then, in the second running of the simulation system, after thread 190 places patch 206 into one or more user threads, where the one or more user threads are specific to the block level determined to have a bug, the patch enables the determination of the signal level location of the bus or defect. In one embodiment, patch 206 consists of code that issues a print statement as the thread is executed. More particularly, the print statement is executed where a defect occurs, such as the inability to access a memory, to pinpoint the location of the problem. Thus, where in the past the process was stopped at each instruction having an error and then restarted again, the embodiments described herein enable looking at errors in chunks. Therefore, the errors can be corrected more efficiently by minimizing the restarting and stopping the simulating process.

In one embodiment, where there are several processors connected by two input and two output sockets to form a small network, a routing table is used to assist the packets reach their destination as soon as possible. Here, the ROM of FIG. 3 will contain the default routing table, which will ensure that all the processors are accessible to the host. In one embodiment, the routing table is loaded by microcode into a particular SRAM location. In another embodiment, the routing table is a 64 bit register (routing register). Here, a 6 bit destination address has one to one correspondence with each bit of the routing register. Whenever a packet arrives, the routing table's respective bit is checked. If the hit is high the packet is forwarded to a horizontal socket, otherwise the packet is forwarded to a vertical socket. Of course, if the packet has the default address or its destination has been reached, then it is processed.

Figure 7:
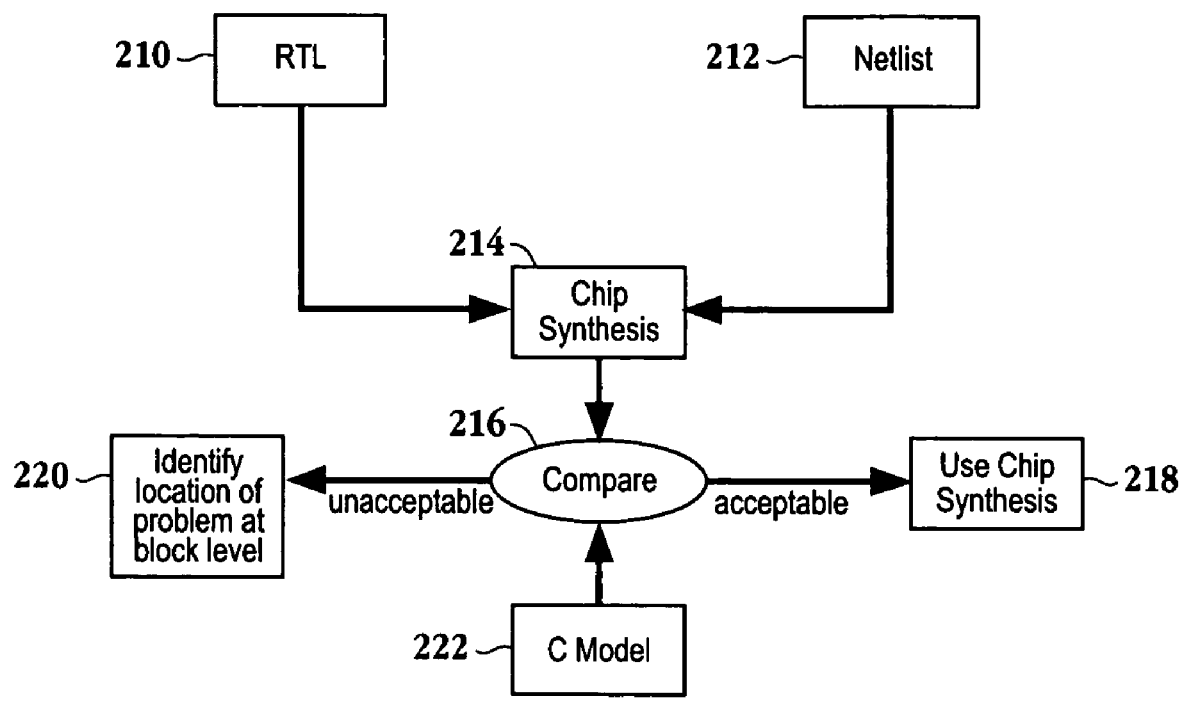
FIG. 7 is a simplified schematic diagram providing a broad overview of a technique for efficiently debugging a chip circuit in accordance with one embodiment of the invention.

FIG. 7 is a simplified schematic diagram providing a broad overview of a technique for efficiently debugging a chip circuit in accordance with one embodiment of the invention. Register transfer logic (RTL) 210 and netlist 212 are combined to provide chip circuit 214 for the pipeline of processors. It will be apparent to one skilled in the art that netlist 212 defines the blocks associated with the processors of the pipeline as well as identifying where multiple instantiations of those blocks occur, while RTL 210 provides the final functional implementation of each of the blocks with respect to the components of each of the processors of the pipeline. It should be appreciated that examples of blocks having multiple instantiations include memory blocks, cyclic redundancy code (CRC) blocks, etc. In one embodiment, RTL 210 includes libraries of high level chip components. C model 222 is a code representation which provides the functionality of the processors of the pipeline. If chip circuit 214 and C model 222 compare acceptably, i.e., there are no differences or errors detected, then the chip circuit is considered acceptable and is used to design the chip. If chip circuit 214 and C model 222 are considered unacceptable when compared in block 216, the location of the problem causing the unacceptable comparison is identified at the block level as discussed in more detail with reference to FIGS. 5, 6, and 10. In one embodiment, the higher level signal values at each stage of the pipeline are compared between the C model and the chip circuit.

Figure 8:
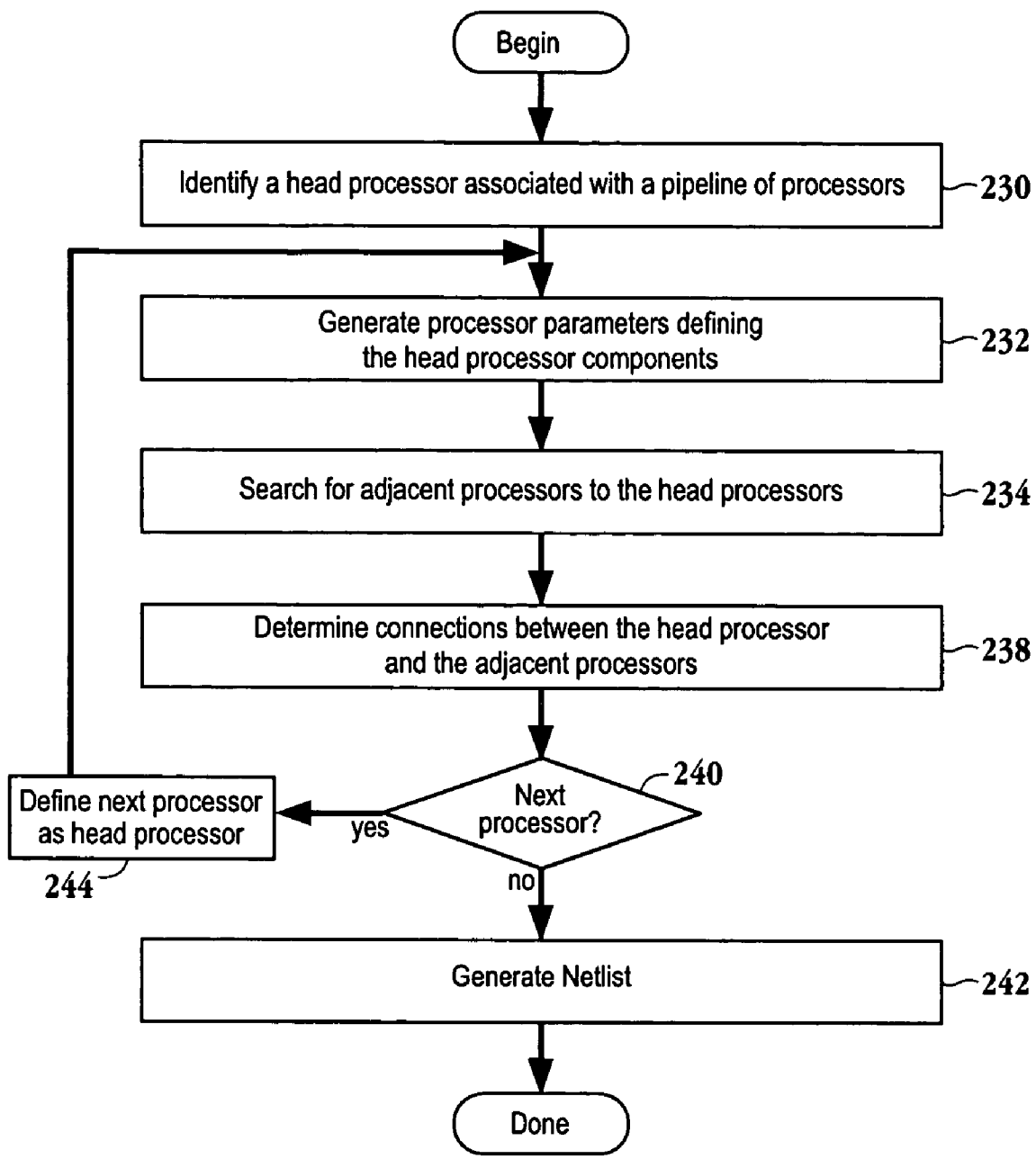
FIG. 8 is a flowchart diagram of the method operations for generating a netlist for a pipeline of processors in accordance with one embodiment of the invention.

FIG. 8 is a flowchart diagram of the method operations for generating a netlist for a pipeline of processors in accordance with one embodiment of the invention. It should be appreciated that an architectural representation of the pipeline architecture tracks the number of processor complexes in the pipeline. Thus, the architectural representation is utilized, as explained below, to assist in generating the netlist. The method initiates with operation 230 where a head processor associated with a pipeline of processors is identified. The head processor may be any of the pipelined processors, such as any of processors 148-1 through 148-n and 150-1 through 150-n, with reference to FIG. 2. That is, the head processor is a starting point and is not necessarily fixed to a particular processor in a pipeline. The method then advances to operation 232 where processor parameters defining the head processor components are generated. Exemplary process parameters defined in the architectural representation of the particular processor include the SRAM memory size, data memory size, code memory size, socket memory size, hardware actuator option, etc. It should be appreciated that the architectural representation is computer code that defines the pipeline architecture illustrated with reference to FIG. 2.

The method of FIG. 8 then proceeds to operation 234 where a search is performed for adjacent processors to the head processor. Thus, a downstream and an upstream processor with respect to the head processor are located in one embodiment. In another embodiment, as a result of the search, a name of the identified processor indicates the stage associated with the processor. For example, the processor may be associated with the IP layer, IP SEC layer, TCP layer, or iSCSI layer with reference to FIG. 2. It should be appreciated that the processor parameters for the adjacent processors can be determined here also. The method then advances to operation 238 where the connections between the head processor and the adjacent processors are determined. In one embodiment, the name of the processor and the parameters of the adjacent processors, both accessed from the architectural representation, provide information on the connection configuration for each side of the head processor. Thus, the connections between the head processor and adjacent processors, such as the bus size, etc. can be determined here. The method then proceeds to decision operation 240 where it is determined if there is a next processor. If there is a next processor, then the method moves to operation 244 where the next processor is defined as the head processor. Then, operations and operation 232, 234, 238 and 240 are repeated as described above. If there is not a next processor, then the method advances to operation 242 where a netlist that includes the connections and the components for the pipeline of processors is generated. Thus, the higher level debugging that occurs at the block level allows identification of which block needs to be looked at instead of having to sift through a number of error signals and manually determining which block is at issue.

Figure 9:
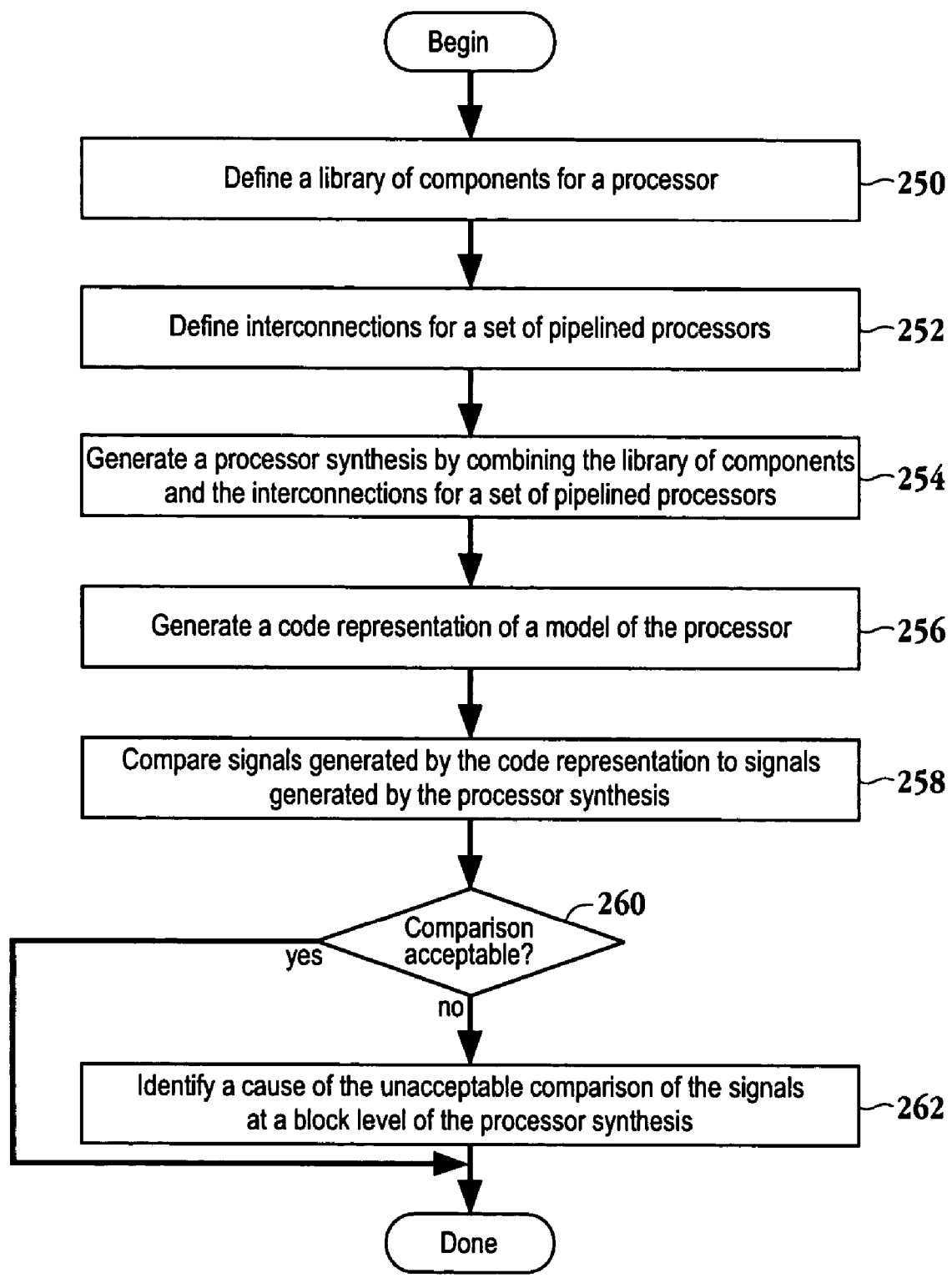
FIG. 9 is a flowchart diagram of the method operations for accommodating changes to a structural netlist in accordance with one embodiment of the invention.

FIG. 9 is a flowchart diagram of the method operations for accommodating changes to a structural netlist in accordance with one embodiment of the invention. The method initiates with operation 250 where a library of components for a processor is defined. In one embodiment, the library of components is captured in the RTL as discussed with reference to FIG. 7. The method then advances to operation 252 where the interconnections for a set of pipelined processors is defined. In one embodiment, the interconnections are defined through a netlist as discussed above. The method then proceeds to operation 254 where a processor circuit is generated. The processor circuit is generated by combining the library of components and the interconnections for a pipeline of processors, where the RTL provides the components of each block and the netlist provides the interconnections between the blocks. The method then moves to operation 256 where a code representation of a model of the processor pipeline is generated. The code representation is referred to above as the C model where the C programming language is used. Thus, the C model is microcode that simulates the functionality of each of the processors in the pipeline.

The method of FIG. 9 then advances to operation 258 where signals generated by the code representation are compared to signals generated by the processor circuit. In one embodiment, the signals at the block level are compared to pinpoint a potential problem or defect. In decision operation 260 it is determined if the comparison of the signals is unacceptable. If the comparison of the signals is unacceptable, then a cause of the unacceptable comparison is identified at a block level of the processor circuit. If the comparison of the signals is acceptable, then the method terminates as the processor circuit is an acceptable circuit.

Figure 10:
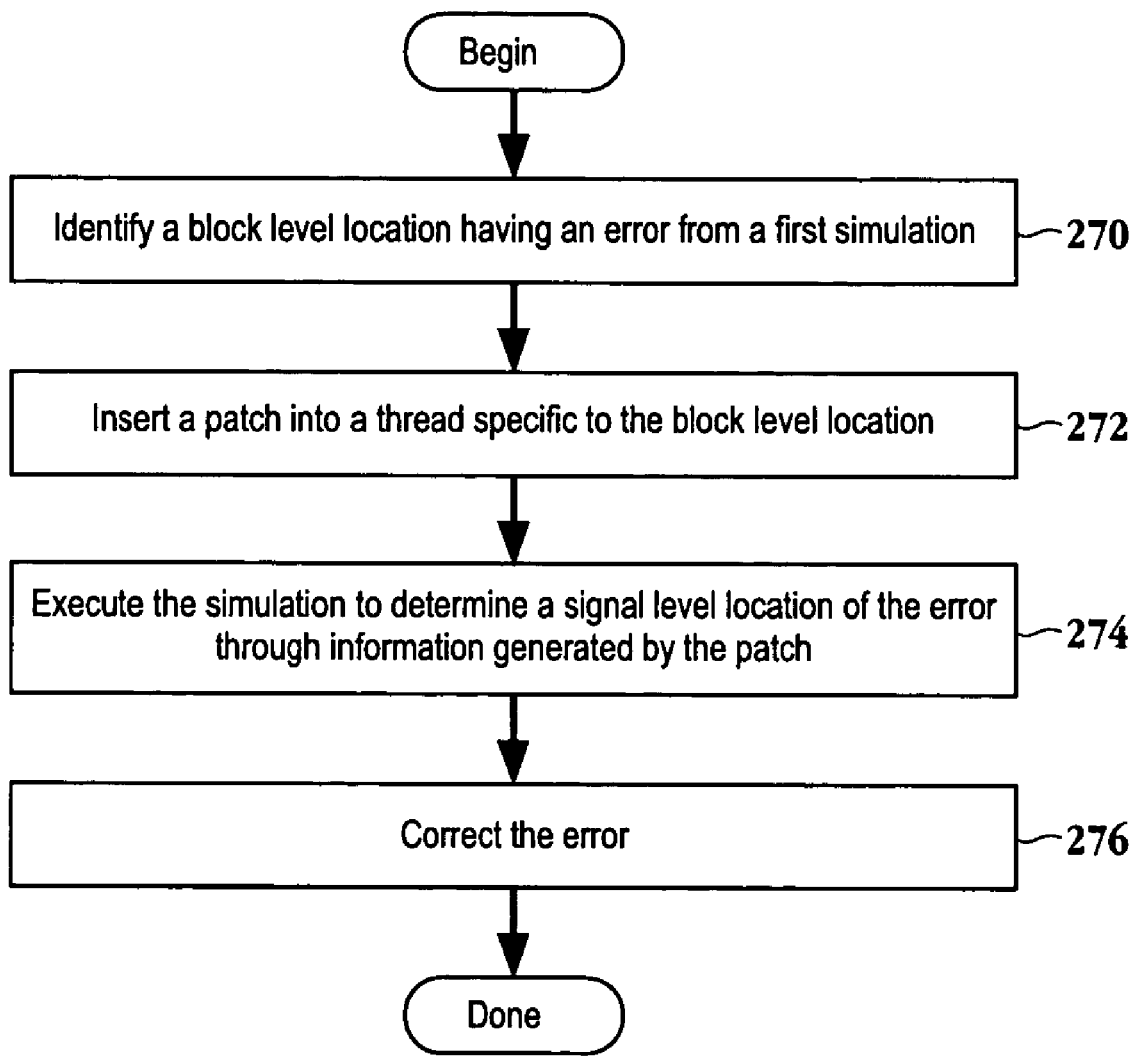
FIG. 10 is a flowchart diagram of the method operations for debugging a chip circuit in accordance of one embodiment of the invention.

FIG. 10 is a flowchart diagram of the method operations for debugging a chip circuit in accordance of one embodiment of the invention. It should be appreciated that if the comparison of the signals is unacceptable as discussed with reference to FIG. 10, then the method operations discussed herein allow for efficient debugging of the processor circuit. The method initiates with operation 270 where a block level location having a bug or defect from a first simulation is identified. In one embodiment, the first simulation is the simulation as described above with reference to FIG. 9 where the comparison of the signals is not acceptable. The method of FIG. 10 then advances to operation 272 where a patch is inserted into a thread that is specific to the block level location having the bug. In one embodiment, the patch is inserted as described above with reference to FIGS. 5 and 6. The method then proceeds to operation 274 where the simulation is executed with the inserted patch to determine a signal level location of the bug or cause of the error. For example, the patch can be a print statement that executes due to a particular problem, such as not being able to access a memory. Thus, the exact location of the error can be pinpointed. The method then moves to operation 276 where the error is then corrected. In one embodiment, the method described with reference to FIG. 10 is used to verify the microcode associated with a C model. Additionally, it should be appreciated that a change to the microcode of the C model does not necessarily change the netlist, as the netlist defines the interconnectivity between processors.

In summary, the embodiments of the present invention provide a simulation model that provides a fast turnaround time by identifying problems during a debugging phase at a block level. In one embodiment, once the block level having the problem is identified, a patch is inserted into a user thread specific to the block level pinpoints the problem. It should be appreciated that the embodiments described herein enable the avoidance of a slow start. That is, after making a modification, the simulation and testing can be performed immediately without performing a slow start, due to the high level of confidence for the modification.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. It should be appreciated that the claims do not imply any particular order of steps or operations, unless explicitly stated that an ordering exists.

What is claimed is:

1. A method for debugging a processor circuit, comprising:
   identifying a block level location having an error from a first simulation;
   inserting a patch into a thread specific to the block level location of the error;
   executing the simulation to determine a signal level location of the error through information generated by the patch; and
   correcting a code representation of a processor associated with the error.

2. The method of claim 1, wherein the patch is a print command.

3. The method of claim 1, wherein the method operation of executing the simulation to determine a signal level location through information generated by the patch includes,
   triggering a print statement indicating the signal level location of the error.

* * * * *